US012666787B2

(12) United States Patent
Larsen et al.

(10) Patent No.: US 12,666,787 B2
(45) Date of Patent: Jun. 23, 2026

(54) LIGHT-EMITTING ELECTROCHEMICAL CELL, SECURITY ELEMENT, SECURITY SYSTEM, METHOD OF OPERATION AND METHOD OF PRODUCTION

(71) Applicant: Lumifoil AB, Umeå (SE)

(72) Inventors: Christian Larsen, Umeå (SE);
Andreas Sandström, Tavelsjö (SE);
Shi Tang, Umeå (SE); Patric Stafshede, Umeå (SE); Ludvig Edman,
Umeå (SE)

(73) Assignee: Lumifoil AB, Umeå (SE)

( * ) Notice: Subject to any disclaimer, the term of this patent is extended or adjusted under 35 U.S.C. 154(b) by 156 days.

(21) Appl. No.: 18/693,461

(22) PCT Filed: Sep. 19, 2022

(86) PCT No.: PCT/SE2022/050818
§ 371 (c)(1),
(2) Date: Mar. 19, 2024

(87) PCT Pub. No.: WO2023/043361
PCT Pub. Date: Mar. 23, 2023

(65) Prior Publication Data
US 2025/0143067 A1      May 1, 2025

(30) Foreign Application Priority Data

Sep. 20, 2021    (SE) .................................... 2151145-6

(51) Int. Cl.
*H10K 50/135*        (2023.01)
*B42D 25/36*         (2014.01)
(Continued)

(52) U.S. Cl.
CPC ........... *H10K 50/135* (2023.02); *B42D 25/36*
(2014.10); *C03C 17/42* (2013.01); *G06V 20/95*
(2022.01);
(Continued)

(58) Field of Classification Search
CPC .. H10K 50/135; H10K 50/813; H10K 71/211;
H10K 71/20; H10K 2101/80;
(Continued)

(56) References Cited

U.S. PATENT DOCUMENTS

2015/0243920 A1*  8/2015  Edman ................... H10K 71/12
438/35

OTHER PUBLICATIONS

International Search Report and Written Opinion for International Application No. PCT/SE2022/050818, mailed Jan. 5, 2023, (14 pages).
(Continued)

*Primary Examiner* — Justin V Lewis
(74) *Attorney, Agent, or Firm* — Kagan Binder, PLLC

(57) ABSTRACT

A light-emitting electrochemical cell (1, 1', 1", 1'") comprises a substrate (10), a first electrode (11), an emission layer (13), contacting the first electrode (11) and providing a first 2D pattern, which is made up by the emission layer being visually distinguishable, and a second electrode (14). The emission layer (13) provides a second 2D pattern, which is made up by first portions (131*a*, 131*b*; 132*a*, 132*b*) which are passive with respect to photoluminescence and second portions (133) of the emission layer which are active with respect to photoluminescence, and a third 2D pattern is provided by regions, which are active with respect to electroluminescence, where the first and second electrodes (11, 14) overlap and electrically contact the second portions (133) of the emission layer (13). There is also disclosed a security element, a security system and methods of operat-
(Continued)

ing and manufacturing the light-emitting electrochemical cell (1, 1', 1", 1''').

23 Claims, 5 Drawing Sheets

(51) Int. Cl.

| | |
|---|---|
| *C03C 17/42* | (2006.01) |
| *G06V 20/00* | (2022.01) |
| *H05B 44/00* | (2022.01) |
| *H10K 50/813* | (2023.01) |
| *H10K 71/20* | (2023.01) |
| *H10K 101/00* | (2023.01) |

(52) U.S. Cl.
CPC ........... *H05B 44/00* (2022.01); *H10K 50/813* (2023.02); *H10K 71/211* (2023.02); *C03C 2217/948* (2013.01); *C03C 2218/112* (2013.01); *C03C 2218/32* (2013.01); *C03C 2218/34* (2013.01); *H10K 2101/80* (2023.02)

(58) Field of Classification Search
CPC ...... H10K 101/00; B42D 25/36; C03C 17/42; C03C 2217/948; C03C 2218/112; C03C 2218/32; C03C 2218/34; G06V 20/95; G06V 20/00; H05B 44/00
USPC ......... 283/67, 70, 72, 74, 85, 87, 91, 94, 98
See application file for complete search history.

(56) References Cited

OTHER PUBLICATIONS

Lindh et al., "Luminescent line art by direct-write patterning," Science & Applications, vol. 5, No. 3, Mar. 25, 2016, (4 pages).
Dick et al., "Imaging the Structure of the P-N Junction in Polymer Lightemitting Electrochemical Cells," Advanced Materials, VCH Publishers, DE, vol. 8, No. 12, Dec. 1, 1996, (3 pages).

* cited by examiner

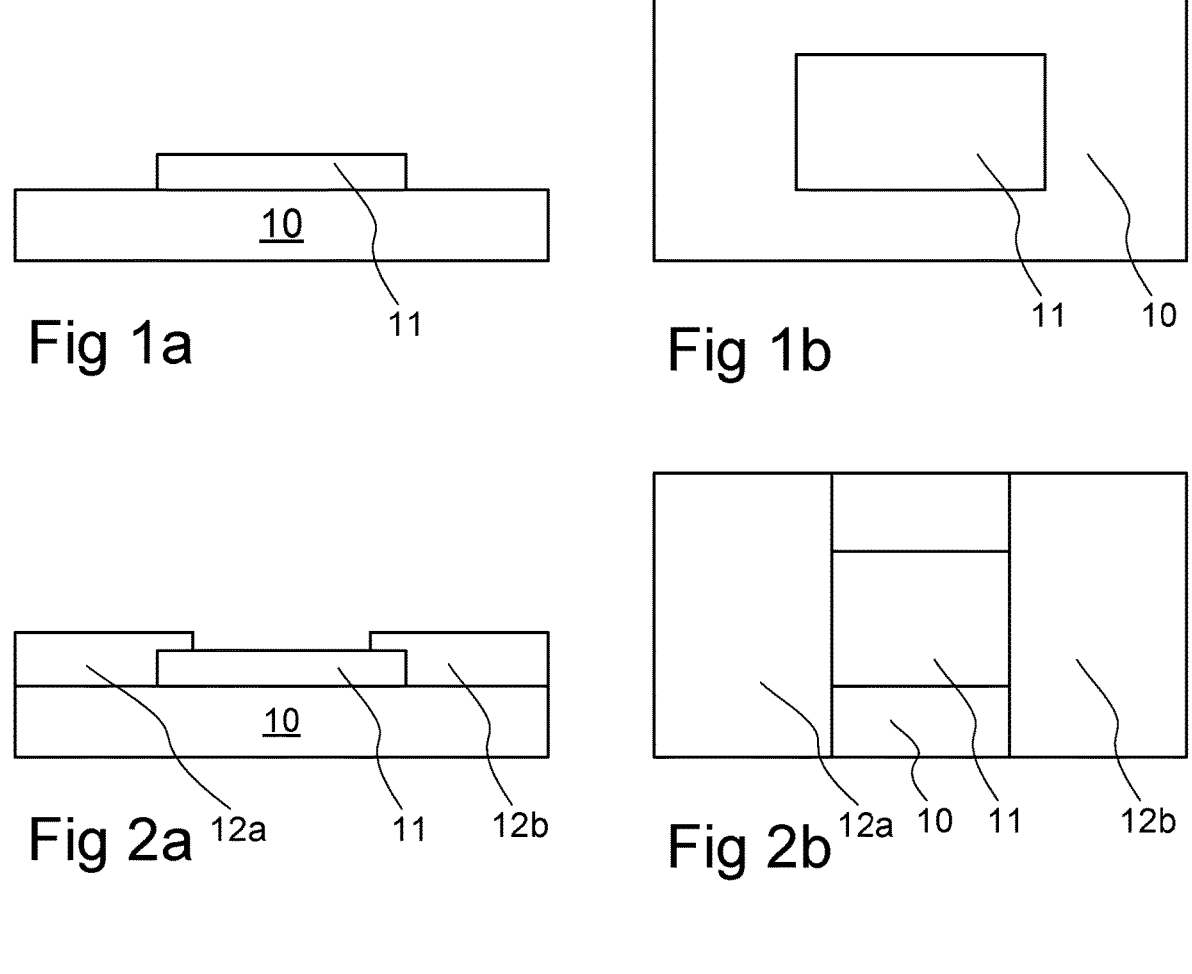
Fig 1a
Fig 1b
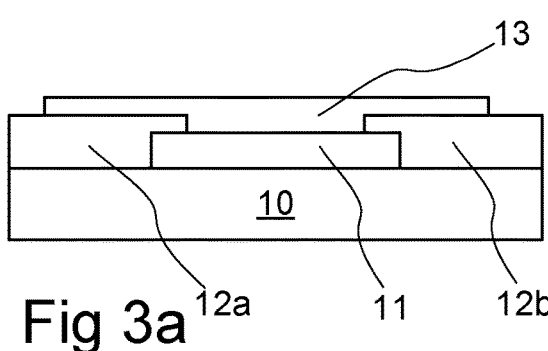
Fig 2a
Fig 2b
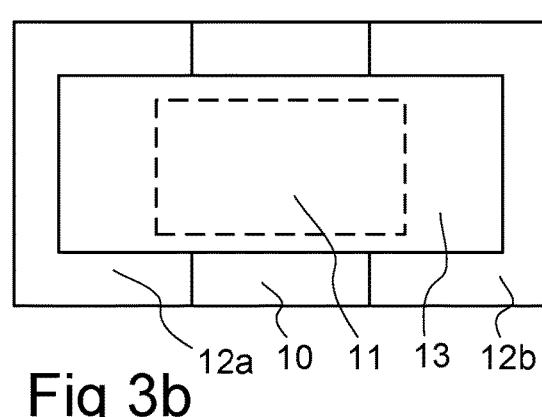
Fig 3a
Fig 3b 21a     3     21b

2

10

131a          12a          13   11   12b     131b

133

21a          21          21b 12a   10   11   13   12b

133

10

132a          12a          13   11   12b     132b

133

132a   12a   10   13  11   12b  132b

1

14

10

132a          12a          13   11   12b     132b

14

132a     12a     10   11   13   12b

132b

LIGHT-EMITTING ELECTROCHEMICAL CELL, SECURITY ELEMENT, SECURITY SYSTEM, METHOD OF OPERATION AND METHOD OF PRODUCTION

CROSS-REFERENCE TO RELATED APPLICATIONS

This application claims priority to International Application No. PCT/SE2022/050818, filed Sep. 19, 2022 and titled "LIGHT-EMITTING ELECTROCHEMICAL CELL, SECURITY ELEMENT, SECURITY SYSTEM, METHOD OF OPERATION AND METHOD OF PRODUCTION," which in turn claims priority from a Swedish Patent Application having serial number 2151145-6, filed Sep. 20, 2021, both of which are incorporated herein by reference in their entireties.

TECHNICAL FIELD

The present disclosure relates to a light-emitting electro-chemical cell, to a security element comprising such a light-emitting electrochemical cell, a security system comprising such security element, to a method of operating a light-emitting electrochemical cell and to a method of manufacturing a light-emitting electrochemical cell.

BACKGROUND

In U.S. Pat. No. 9,592,701, there is disclosed a security element comprising a multi-layer flexible film body, in which one or more light-emitting elements are arranged to radiate light when activated, each such element being formed of a self-luminous, electrically operated, display element.

Such security elements may be applied to various types of documents, including bank notes, identification documents, such as passports, product labels, product packages, and the like, in order to indicate authenticity.

In U.S. Pat. No. 9,592,701, there is disclosed that the light-emitting elements can be formed from e.g. a light-emitting electrochemical cell.

Light-emitting electrochemical cells (hereinafter referred to as "LEC") and methods of their manufacture and operation are known from e.g. WO2010085180A1, WO2011053236A1, WO2015144204A1, WO2014064298A1, WO2017088901A1, and WO2018133930A1.

As such, LECs are known to generate light through electroluminescence, hence enabling the provision of an electrically activated 2D pattern of light emission in a device that can be produced at very low cost through various printing techniques, and that can be activated by a relatively low voltage. In the present context, a 2D pattern is a pattern, which has two dimensions, as opposed to a 3D pattern, which would provide a pattern in three dimensions.

There is a need for improved security elements.

SUMMARY

It is an object of the present disclosure to provide an improved device which is difficult to copy, in that it is capable of generating different patterns during different conditions. A particular object is to provide an improved security element, and in particular a security element which has a high level of security, while being possible to produce at relatively low cost, and while being robust and user friendly in its operation.

The invention is defined by the appended independent claims, with embodiments being set forth in the dependent claims, in the following description and in the drawings.

According to a first aspect, there is provided a light-emitting electro-chemical cell, comprising a substrate, a first electrode, an emission layer, contacting the first electrode and providing a first 2D pattern, which is made up by the emission layer being visually distinguishable, and a second electrode. The emission layer provides a second 2D pattern, which is made up by first portions which are passive with respect to photoluminescence ("PL") and second portions of the emission layer which are active with respect to photolu-minescence. A third 2D pattern is provided by regions, which are active with respect to electroluminescence, where the first and second electrodes overlap and electrically contact the second portions of the emission layer.

The term "visually distinguishable" means that the pattern can be visually distinguished from the substrate and/or from the rest of a component or an item, on which the light-emitting electrochemical cell is applied. The first 2D pattern may be distinguishable mainly, and in particular entirely, by reflection of incoming illumination light.

The emission layer may be visually distinguishable to the human eye and/or to an image sensor under normal light conditions and/or when subjected to light with specific wavelengths.

The first and second electrodes may at least partially sandwich the emission layer.

Alternatively, the electrodes and the emission layer may be arranged in a side-by side arrangement on a planar substrate.

At least one of the electrodes may be transparent.

The first portions, which are passive with respect to photoluminescence, may be formed by selective in situ deactivation of the emission layer itself. Alternatively, or as a supplement, the first portions may be formed by selective deposition of a material, which as such does not have any ability to exhibit photoluminescence, or of the same material as the emission layer, but which has been deactivated prior to deposition.

It is further noted that the first portions may be more or less deactivated with respect to photoluminescence. That is, the deactivated portions may exhibit some photolumines-cence, but less than the second portions. Moreover, it is possible to provide first portions which are deactivated to different degrees, such that a pattern may comprise stepwise transitions between full and partial, or no, photolumines-cence.

The emission layer may comprise multiple portions which may have differing properties that make the portions distin-guishable from each other, e.g. in terms of reflection color, photoluminescence (fluorescence or phosphorescence) or electroluminescence ("EL"). Hence, the emission layer may be deposited in several steps, wherein each step may include the deposition of portions having different properties. Alter-natively, the portions may be deposited simultaneously, as would be possible with a color inkjet printer.

That the emission layer is selectively deactivated with respect to PL means that it has been modified to partially or completely lose its capacity to luminesce following excita-tion by light.

Hence, the emission layer may be made up of portions which are PL active and portions which are PL deactivated.

In such an LEC, the first 2D pattern can be detected in any normally illuminated environment, whereas the second 2D pattern can be detected through light-induced excitation of the emission layer, such as by exposure to UV light.

Hence, so far, this LEC is capable of providing two different patterns.

The third 2D pattern further provides portions of the emission layer that are EL active, which are defined by the overlap of the electrodes and their electrical contact to the portions of the emission layer that are PL active. During electrical operation, the PL capacity of the third pattern is at least partially quenched by the electrochemical doping. This results in a modified PL pattern after electric operation of the LEC, different from that before electrical operation.

Hence, the third 2D pattern will be visible upon electric operation of the device such that EL is caused in parts of the emission layer, and a fourth 2D pattern will be formed by a combination of the second 2D pattern and, effectively, an inverse of the third 2D pattern, immediately after the LEC has been electrically operated and when the LEC is again subjected to excitation light.

When the LEC is subjected to excitation light at regular time intervals directly following electrical operation, the fourth 2D pattern will be observed to gradually return to the second 2D pattern during a recovery phase, as the electrochemical doping relaxes and the concomitant PL loss of the emission layer defined by the third 2D pattern recovers.

Alternatively, it is possible to electrically operate the LEC such that the PL capacity is permanently destroyed and thus irreversible. In such cases, it will still be possible to distinguish four different patterns during one operation cycle.

The light-emitting electrochemical cell may be configured such that the second 2D pattern is visually distinguishable when at least the second portions are optically excited to photoluminescence.

The light-emitting electrochemical cell may be configured such that the third 2D pattern is visually distinguishable when an electrical potential is applied between the electrodes, and wherein the application of the electrical potential between the electrodes at least partially quenches the photoluminescence of said regions, such that a fourth 2D pattern is visually distinguishable after the electrical potential has been removed and at least the second portions of the second 2D pattern are excited to photoluminescence.

The light-emitting electrochemical cell may be configured such that a temporal transition from the fourth 2D pattern to the second 2D pattern after the electrical operation is detectable by excitation of at least second portions of the second 2D pattern to photoluminescence.

The light-emitting electrochemical cell may further comprise an insulating layer, which is selectively provided between the emission layer and one of the electrodes, such that the third 2D pattern, is at least partially determined by the insulating layer.

Hence, alternatively, or in addition, to selectively patterning the electrodes, it is possible to selectively pattern a layer of insulating material that separates one of the electrodes from the emission layer to thus provide the third 2D pattern, and as a consequence, also the fourth 2D pattern.

The insulating layer may be formed from a material selected from a group consisting of polymers (such as epoxies, acrylics, polymethylmetacrylate, polystyrene, polyethylene terephtalate, polyethylene naphtalate), ceramics and glasses (such as $SiO_2$, $Al_2O_3$).

The emission layer may comprise a blend of one or several organic and/or inorganic semiconductors and one or several sources of mobile ions.

The organic semiconductor may be selected from a group consisting of non-ionic and ionic transition-metal complexes, conjugated polymers, conjugated small molecules, organic, carbon and perovskite quantum dots, and various types of specialty emitters featuring thermally activated delayed-fluorescence, the inorganic semiconductor can be selected from a group consisting of inorganic quantum dots and perovskites, and the mobile ions can be selected from a group comprising salts dissolved in ion-dissolving compounds and ionic liquids.

In some embodiments, a surfactant may be included in the emission layer.

The substrate may be formed from one or several materials selected from the groups consisting of glasses (such as float glass, borosilicate glass, quartz glass, $SiO_2$, $Al_2O_3$), polymers (such as PET, polycarbonate, PEN), pulp based materials (such as paper, cardboard), metallic materials and meshes (such as Al, Ag, Cu, Ni) and moisture and oxygen barrier materials.

At least one of the electrodes may be formed from one or a combination of several materials selected from a group consisting of metals, such as Al, Ag, Cu, and Ni, doped and pristine inorganic semiconductors, such as ZnO, $TiO_2$, ITO, and FTO, doped and pristine organic semiconductors, such as PEDOT:PSS, and polymers, such as polyethylene imine, polystyrene, PMMA and epoxies, in the form of films, sintered (nano) particles, (nano) wires, flakes or wire meshes.

According to a second aspect, there is provided a security element, comprising a light-emitting electrochemical cell as described above, and a power supply, which is operatively coupled to the first and second electrodes, for selective activation of the light-emitting electrochemical cell.

The power supply may be integrated with the security element, as would be the case where a battery or a capacitor is used to power the LEC, or it may be provided in the form of a power interface for temporary connection to an external power supply. Hence, the power supply may comprise power terminals and/or an induction antenna, such that the LEC may receive external power.

The security element may be applied to an item that is to be authenticated, such as, but not limited to, a document, a label, an identification device, such as a passport, a driver's license, etc., a packaging, or a product.

In the security element, the power supply may be selected from a group comprising an electric accumulator, such as a capacitor or a battery, an electric generator, such as an induction antenna or a solar cell, and optionally a rectifier.

According to a third aspect, there is provided a security system, comprising a security element as described above, and an excitation light source configured to provide light of a wavelength range for causing photoluminescence in the emission layer.

The security system may further comprise at least one image capture device, and at least one processing device. The processing device may be configured to receive data from the image capture device, the image representing at least part of an emission layer area of the security element, and processing the data to determine authenticity of the security element.

The image capture device may be a camera configured for capturing pattern images and/or for capturing hyperspectral images. The image capture device may comprise, or perform the function of, a spectrometer.

The security system may further comprise a spectrometer, configured for capturing an emission and/or reflection spectrum of at least a part of the light-emitting electrochemical cell.

According to a fourth aspect, there is provided a method of operating a light-emitting electrochemical cell, wherein the light-emitting electrochemical cell comprises a substrate, a first electrode, an emission layer, contacting the first electrode and providing a first 2D pattern, which is made up by the emission layer being visually distinguishable, and a second electrode, wherein the emission layer provides a second 2D pattern, which is made up by first portions which are passive with respect to photoluminescence and second portions of the emission layer which are active with respect to photoluminescence, wherein a third 2D pattern is provided by regions, which are active with respect to electroluminescence, where the first and second electrodes overlap and electrically contact the second portions of the emission layer. The method comprises providing the light-emitting electro-chemical cell with only the first 2D pattern being visually distinguishable, exposing the light-emitting electro-chemical cell to first excitation light, whereby the second portions of the emission layer are caused to provide photoluminescence, such that the second 2D pattern becomes visually distinguishable, electrically operating the light-emitting electrochemical cell so as to cause electroluminescence in said emission layer by applying an electric potential between the electrodes, such that the third 2D pattern becomes visually distinguishable.

The method may further comprise stopping the electrical operation of the light-emitting electrochemical cell, and subsequent to said electrical operation, exposing the light-emitting electrochemical cell to second excitation light, such that a fourth 2D pattern becomes visually distinguishable, said fourth pattern corresponding to the second 2D pattern and an inverse of the third 2D pattern.

The method may further comprise capturing a fourth image representing the light-emitting electrochemical cell during said exposure of the light-emitting electrochemical cell to said second excitation light.

The fourth image can be stored, transmitted or immediately received by a processing device, where it can be subject to authentication processing, which may include comparison with one or more predetermined criteria, such as reference masks, reference images or reference features.

The method may further comprise capturing fourth spectral data representing photoluminescence from at least part of the light emitting electrochemical cell during said exposure of the light emitting electrochemical cell to said second excitation light.

The fourth spectral data can be stored, transmitted or immediately received by a processing device, where it can be subject to authentication processing, which may include comparison with one or more predetermined criteria, such as reference masks, reference images or reference features.

The LEC may be subjected to excitation light subsequent to electrical operation to visualize the PL-recovery transition from the fourth 2D pattern to the second 2D pattern. The excitation light may be provided as pulses, so that the recovery of the PL of the emission layer may be recorded as intensity images and/or spectral data. Hence, the PL behavior during the recovery phase may be followed.

In the method, the electrical operation may comprise reversibly quenching the PL capacity of the regions.

Alternatively, the electrical operation may comprise permanently quenching the PL capacity of the regions.

The method may further comprise capturing a first image representing the light-emitting electrochemical cell while the light-emitting electrochemical cell is exposed to at least non-excitation light and prior to said exposing of the light-emitting electrochemical cell to the first excitation light, and capturing a second image representing the light-emitting electrochemical cell during said exposing of the light-emitting electrochemical cell to the first excitation light.

The non-excitation light should be such as to allow the first pattern to be distinguished, and thus essentially not to provide such excitation as to invoke the second pattern.

The first and second images can be stored, transmitted or immediately received by a processing device, where it can be subject to authentication processing, which may include comparison with one or more predetermined criteria, such as reference masks, reference images or reference features.

In the method, capturing said first and/or second image may comprise capturing first spectral data and/or second spectral data representing light emission from at least part of the light-emitting electrochemical cell during said exposing of the light-emitting electrochemical cell to the first excitation light.

The spectral data can be stored, transmitted or immediately received by a processing device, where it can be subject to authentication processing, which may include comparison with one or more predetermined criteria, such as reference masks, reference images or reference features.

The method may further comprise capturing at least one emission intensity transient directly following said exposing of the light-emitting electrochemical cell to the first excitation light, thus enabling a distinction between fast-decaying fluorescence and comparatively slow-decaying phosphorescence.

The transient data can be stored, transmitted or immediately received by a processing device, where it can be subject to authentication processing, which may include comparison with one or more predetermined criteria, such as reference masks, reference images or reference features.

The method may further comprise capturing a third image representing the light-emitting electrochemical cell during said electroluminescence.

The third image can be stored, transmitted or immediately received by a processing device, where it can be subject to authentication processing, which may include comparison with one or more predetermined criteria, such as reference masks, reference images or reference features.

The method may further comprise capturing third spectral data representing light emission from at least part of the light-emitting electrochemical cell during said electroluminescence.

The third spectral data can be stored, transmitted or immediately received by a processing device, where it can be subject to authentication processing, which may include comparison with one or more predetermined criteria, such as reference masks, reference images or reference features.

In the method the electrical operation may be performed subsequently to said exposure of the light-emitting electrochemical cell to the first excitation light.

Alternatively, the electrical operation may be performed prior to said exposure of the light emitting electrochemical cell to the first excitation light.

The method may further comprise capturing at least two images representing the photoluminescence from the light-emitting electrochemical cell, during said exposure of the light-emitting electrochemical cell to the second excitation light, at different points in time.

The images taken during the recovery phase can be stored, transmitted or immediately received by a processing device, where it can be subject to authentication processing, which may include comparison with one or more predetermined criteria, such as reference masks, reference images or reference features. In addition, temporal analysis based on a sequence of images may be performed, based on which the recovery/relaxation behavior may be determined and compared with a reference recovery/relaxation behavior.

In the method said points in time may occur during a recovery phase in which the photoluminescence recovers from the electrochemical doping quenching.

In the method, spectral data may be captured for at least some of the images representing the light-emitting electrochemical cell at different points in time during a recovery phase, during which said photoluminescence recovers.

According to a fifth aspect, there is provided a method of manufacturing a light-emitting electrochemical cell, comprising providing a substrate, depositing a first electrode on the substrate, depositing an emission layer, which contacts and at least partially overlaps the first electrode, to provide a first 2D pattern, which is made up by emission layer being visually distinguishable from the substrate, providing a second 2D pattern, which is made up by first portions which are passive with respect to photoluminescence and second portions of the emission layer which are active with respect to photoluminescence, and depositing a second electrode, which contacts and at least partially overlaps the emission layer, and which at least partially overlaps the first electrode, to form regions which are active with respect to electroluminescence.

In the method said providing deactivated portions of the emission layer may comprise selectively deactivating portions of the deposited emission layer.

The selective deactivation may be performed by subjecting the emission layer to a particular atmosphere and a particular light exposure.

The light exposure may be selectively applied by a mask and/or by using a controllable light beam.

In the method, said providing deactivated portions of the emission layer comprises selectively depositing non-active material.

In the method the electrodes may be selectively deposited with an overlap and with electrical contact with the portions of the emission layer with its photoluminescence being active, according to a third 2D pattern.

Alternatively, or as a supplement, the method may further comprise selectively depositing at least one insulating layer between the emission layer and one of the electrodes, wherein the insulating layer is preferably selectively deposited according to a third 2D pattern.

BRIEF DESCRIPTION OF THE DRAWINGS

FIGS. 1a-1b schematically illustrate a first step in a method of manufacturing an LEC.

FIGS. 2a-2b schematically illustrate a second step in a method of manufacturing an LEC.

FIGS. 3a-3b schematically illustrate a third step in a method of manufacturing an LEC.

DETAILED DESCRIPTION

Figures 4A, 4B, 5A, 5B, 6A, 6B:
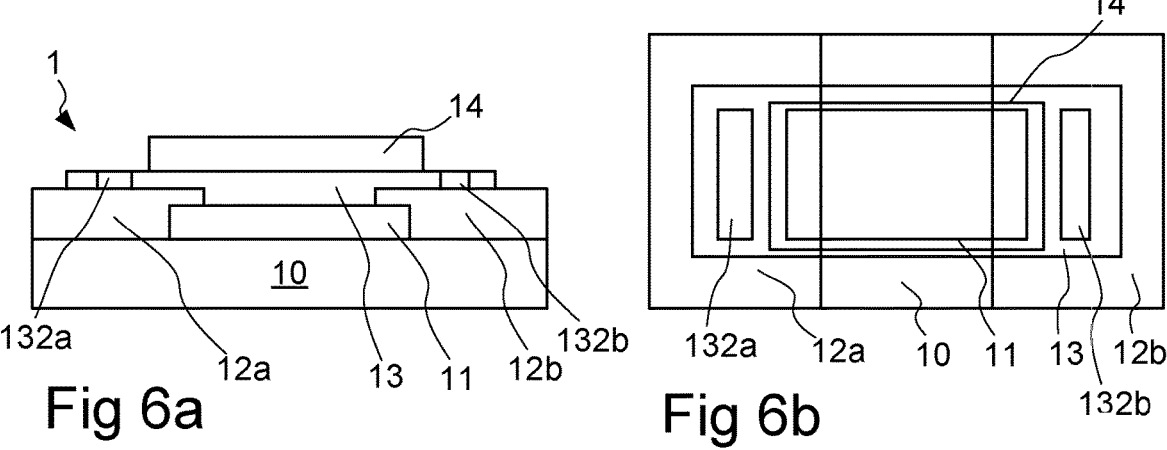
FIGS. 4a-4b schematically illustrate a fourth step in a method of manufacturing an LEC.
FIGS. 5a-5b schematically illustrate an alternative route to the third and the fourth step in a method of manufacturing an LEC.
FIGS. 6a-6b schematically illustrate a fifth step in a method of manufacturing an LEC.

Referring to FIGS. 1a-1b, a first step in a method of manufacturing an LEC 1 comprises providing a substrate 10, which may be formed from one or several materials from groups of electrically insulating materials, such as glasses (float glass, borosilicate glass, quartz glass, $SiO_2$, $Al_2O_3$, etc.), ceramics, polymers (PET, PC, PEN, etc.), pulp based materials (paper, cardboard, etc.), moisture and oxygen barrier materials, and electrically conductive materials, such as a metallic materials and wire meshes (e.g. Al, Ag, Cu, Ni).

The substrate may have any shape that allows for the deposition of the ensuing layers of material, including planar, single curved, double curved, convex, concave, etc.

The substrate may be flexible or rigid.

In particular embodiments, the substrate may be a thin polymer or barrier film or a sheet of paper.

In embodiments, where an electrically conducting substrate is used, it may be desirable to use the conducting substrate as the first electrode. In other embodiments where an electrically conducting substrate is used, it may be desirable to provide a patterned insulating base layer prior to the provision of the emission layer. In other embodiments where an electrically conducting substrate is used, it may be desirable to provide an insulating base layer prior to the provision of the first electrode. In other embodiments where an electrically conducting substrate is used, it may be desirable to use the substrate to couple power to the LEC 1.

The first electrode 11 may be deposited on the substrate 10.

Suitable deposition techniques include inkjet, gravure, offset and screen printing, spray, bar and slot-die coating, thermal and e-beam evaporation, chemical vapor deposition and sputtering.

The first electrode 11 may be provided as one or several conducting materials in combination with one or several non-conducting materials, such as metals (Al, Ag, Cu, Ni, etc.), doped or pristine inorganic and organic semiconductors (ZnO, $TiO_2$, ITO, FTO, PEDOT:PSS, etc.), and polymers (PEI, polystyrene, PMMA, epoxies, etc.), which may be deposited as a thin film, sintered (nano) particles, (nano) wires, flakes, or a wire mesh.

In some embodiments, the first electrode 11 may be deposited as a layer covering all or some parts of the substrate 10.

In some embodiments, the first electrode 11 may be deposited as a 2D pattern. Separate portions of such a 2D pattern may need to be electrically interconnected.

In some embodiments, the first electrode 11 may be deposited as multiple electrically separated 2D patterned electrodes to allow for multiple emission patterns.

Referring to FIGS. 2a-2b, a second step in a method of manufacturing an LEC 1 may comprise depositing an electrically insulating layer 12a, 12b onto parts of the substrate 10 and onto parts of the first electrode 11.

Hence, the insulating layer 12a, 12b may provide a 2D pattern.

The insulating material 12a, 12b may be a polymer (epoxy, acrylic, PMMA, PS, etc.), a ceramic or a glass ($SiO_2$, $Al_2O_3$, etc.).

Suitable deposition techniques include inkjet, gravure, offset and screen printing, spray, bar and slot-die coating, thermal and e-beam evaporation, chemical vapor deposition and sputtering.

Referring to FIGS. 3a-3b, a third step in a method of manufacturing an LEC comprises depositing an emission layer 13 onto parts of the first electrode 11 and onto parts of the insulating layer 12a, 12b and optionally onto parts of the substrate 10.

The emission layer 13 may comprise a blend of one or several organic semiconductors (e.g. non-ionic and ionic transition-metal complexes, conjugated polymers, conjugated small molecules, organic, carbon and perovskite quantum dots, and various types of specialty emitters featuring thermally activated delayed-fluorescence) and/or inorganic semiconductors (e.g. inorganic quantum dots and perovskites) and one or several sources of mobile ions (e.g. salts dissolved in an ion-dissolving compounds or ionic liquids).

Non-limiting examples of the organic semiconductors are poly(1,4-phenylenevinylene), Super Yellow, MEH-PPV, poly(fluorene), poly(9-vinycarbazole), 1,3-bis[2-(4-tert-butylphenyl)-1,3,4-oxadiazo-5-yl]benzene, tris[2-(5-sub-stituent-phenyl)-pyridinato]iridium (III) and 2,4,5,6-Tetra (9H-carbazol-9-yl)isophthalonitrile.

Non-limiting examples of the inorganic semiconductors are CdSe/ZnS, CdTe, CdSeTe/ZnS, PbS quantum dots and perovskite quantum dots, films and structures.

Non-limiting examples of the mobile ions are one or several of the salts $KCF_3SO_3$ and $LiCF_3SO_3$ dissolved in one or several of the ion-dissolving materials poly(ethylene oxide) and trimethylolpropane ethoxylate and its derivatives or one or several of the ionic liquids tetrahexylammonium tetrafluoroborate and tetrabutylammonium hexafluorophosphate.

The emission layer 13 may be deposited by means of a technique such as spray coating, blade coating, slot-die coating, screen printing, gravure printing, offset printing, inkjet printing, thermal evaporation or e-beam evaporation.

The emission layer 13 can be provided in a 2D pattern, which is distinguishable from the substrate 10 and/or from the structure on which the LEC 1 is supported.

The emission layer 13 may be deposited in the form of a single material system and layer, exhibiting a distinct set of reflection, photoluminescence and electroluminescence properties, or in the form of two or more different material systems and layers, exhibiting different such properties.

Where the insulating material 12a, 12b is deposited, it will provide electrical insulation between the first electrode 11 and the emission layer, in accordance with its 2D pattern.

In some embodiments, the emission layer 13 may be visibly distinguishable from the substrate 10 and/or the rest of the device structure by the human eye under normal light conditions.

In other embodiments, the emission layer 13 may not be visibly distinguishable from the substrate and/or the rest of the device structure by the human eye under normal light conditions, but only under conditions where the emission layer 13 and the substrate 10 and/or the rest of the device structure is subjected to light of a particular wavelength.

In yet other embodiments, the emission layer 13 may be visibly distinguishable only when viewed through an optical filter and/or when viewed by a camera that is configured to a particular wavelength. Such embodiments may provide the visible distinction under normal light conditions, or only when the emission layer is subjected to light of a particular wavelength.

In some embodiments, multiple emission layers 13 may be deposited in separate or overlapping 2D patterns, exhibiting identical or different reflection, photoluminescence and/or electroluminescence properties, where each pattern may require one or several particular wavelengths of light to be distinguishable and/or may require a camera configured to a particular wavelength to be imaged.

Referring to FIGS. 4a-4b a fourth step in a method of manufacturing an LEC may comprise selectively and permanently deactivating the photoluminescence of the emission layer 13 according to a 2D pattern.

The deactivation may be achieved through one or several light or particle initiated chemical reactions and take place between the organic or inorganic semiconductor(s) or the ion-dissolving material(s) or the mobile ion(s) on the one hand and one or several reactive molecules ($O_2$, $H_2O$, etc.) on the other hand.

For example, the deactivation may be achieved by selectively exposing portions of the emission layer 13 to UV light from an UV light source 3 in an atmosphere containing a reactive molecule, such as $O_2$.

In order to provide the 2D pattern, a mask 2 having apertures 21a, 21b which are effectively transparent to the UV light may be used. At portions 131a, 131b of the emission layer 13 corresponding to the apertures 21a, 21b, the photoluminescence of the emission layer 13 is deactivated.

Alternatively, a controlled light beam may be used to selectively expose the emission layer 13 according to the desired 2D pattern, for example achieved by digital light processing, "DLP", or by spatial light modulation, "SLM".

A spatially gradual deactivation of the emission layer may be obtained by spatially varying the dose received by different parts of the emission layer. This may be achieved by spatially varying the light intensity, exposure time or reaction gas concentration.

Referring to FIGS. 5a-5b, an alternative route to the third and the fourth step in a method of manufacturing an LEC, where the emission layer 13 as described in the third step is instead deposited with voids 132a, 132b corresponding to the regions 131a, 131b, and where materials with different or absent photoluminescence capacity are separately deposited into these voids 132a, 132b to form the desired 2D pattern. With this direct deposition route, the deactivation procedure described in the fourth step is optional and not required.

The deposition techniques in this alternative route may be the same as for the emission layer deposition described in the third step.

Optionally, additional reflection and photoluminescence 2D patterns may be produced by deposition of color and/or photoluminescent pigments in regions outside of, or partially overlapping, the emission layer 13.

Referring to FIGS. 6a-6b, in a fifth step in a method of manufacturing an LEC, a second electrode 14 may be deposited.

The second electrode 14 may be provided in the form of a coated, printed, evaporated or sputtered layer.

Suitable deposition techniques include inkjet, gravure, offset and screen printing, spray, bar and slot-die coating, thermal and e-beam evaporation, chemical vapor deposition and sputtering, depending on which electrode material is to be used.

The second electrode 14 may be provided as one or several conducting materials in combination with one or several non-conducting materials, such as metals (Al, Ag, Cu, Ni, etc.), doped or pristine inorganic and organic semi-conductors (ZnO, $TiO_2$, ITO, FTO, PEDOT:PSS, etc.), and polymers (epoxy, acrylic, PEI, poly(styrene), PMMA, etc.), which are deposited as a thin or compact film, sintered (nano) particles, (nano) wires, flakes, or a wire mesh.

In some embodiments, the second electrode 14 may be deposited as a layer overlapping all or some of the emission layer 13, the insulating layer 12a, 12b, the first electrode 11 and the substrate 10.

In some embodiments, the second electrode 14 may be deposited as a 2D pattern.

In some embodiments, the second electrode 14 may be deposited as multiple electrically separated electrodes to allow for multiple unique emission patterns.

Optionally, an electrically insulating layer, as described in the second step, may be deposited before the second electrode 14, so as to provide electrical insulation between the emission layer 13 and the second electrode 14. Hence, the insulating layer between the emission layer 13 and the second electrode 14 may provide a 2D pattern.

In some embodiments, the first electrode 11, the emission layer 13, and the second electrode 14 may be deposited in a horizontal geometry, side by side, (a k a "surface configuration") rather than the vertical geometry ("sandwich configuration").

Figure 7A:
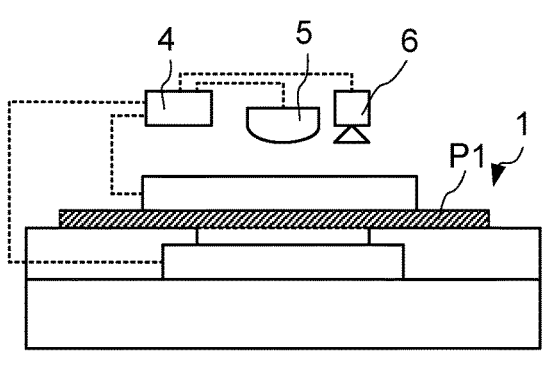
FIGS. 7a-7b schematically illustrate a first step in a method of operating an LEC.
Figure 7B:
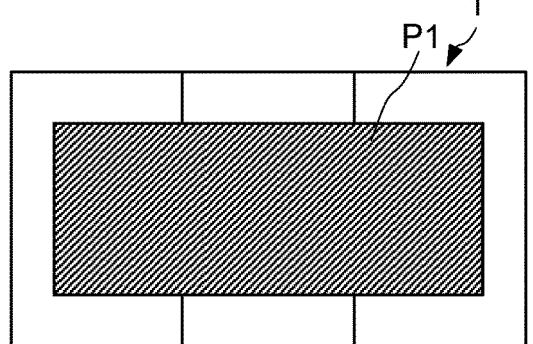

FIGS. 7a-7b schematically illustrate a first step in a method of operating an LEC 1.

In this first step, the LEC 1 may be viewed in light of a suitable wavelength range, wherein a first 2D pattern P1 is visible, provided by the optical contrast between the emission layer 13 and the substrate 10 and/or the rest of the device structure. In some embodiments, the light used in this step need not provide any noticeable excitation to PL.

In some embodiments, a lamp 5 may be activated to expose the LEC 1 to one or multiple suitable light wavelengths or a suitable broad-band light-emission spectrum.

At this step, a first image distinguishing P1 on the LEC 1 may be acquired using an image capture device 6, which may be controlled by a controller 4, which is configured to receive and store images and spectral information.

In some embodiments, the image capture device 6 may also capture spectral information about the light. The spectrometer function may be integrated with the image capture device 6 and used in any image capture step in relation to the LEC 1.

In some embodiments, the image capture device 6 may capture multiple images and spectra during different wavelength illumination conditions from lamp 5.

The controller 4 may further be configured to process the first image(s) and spectrum/spectra, e.g. by comparing to authentication criteria.

Figure 8A:
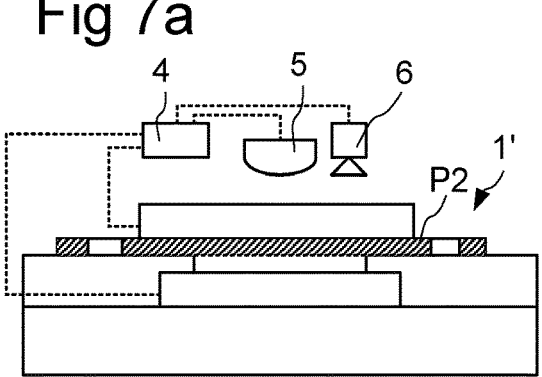
FIGS. 8a-8b schematically illustrate a second step in a method of operating an LEC.
Figure 8B:
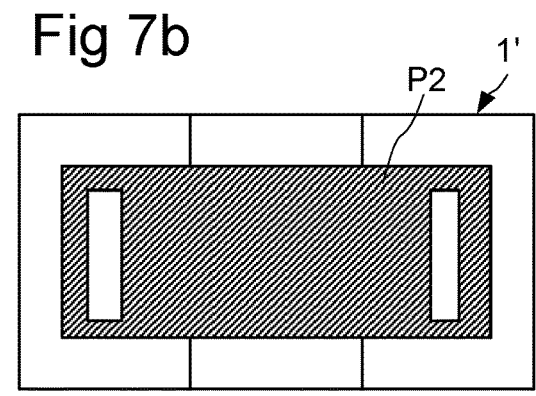

FIGS. 8a-8b schematically illustrate a second step in a method of operating an LEC 1'.

In this step, a lamp 5 may be activated to expose the LEC 1' to light, such that the emission layer 13 is caused to emit light through PL in accordance with a second 2D pattern P2, which is provided through the contrast in PL efficiency and spectra between the non-deactivated portions 133 of the emission layer 13 and the deactivated portions 131a, 131b or non-active portions 132a, 132b, as the case may be.

The lamp 5 may be activated to expose the LEC 1' to one or multiple suitable light wavelengths or a suitable broader wavelength spectrum that can excite the desired PL in the emission layer.

The lamp 5 may be controlled by the controller 4, and also during this step, the image capture device 6 may be used to acquire a second image distinguishing P2 from LEC 1'.

In some embodiments, the image capture device 6 may also capture spectral information of the PL light.

In some embodiments, the image capture device 6 may capture multiple PL images and spectra during different wavelength illumination conditions from lamp 5.

In some embodiments, the image capture device 6 may also capture temporal intensity and/or spectral information of the PL during a transient phase directly after exposure to excitation light from the lamp 5, in order to distinguish between a fluorescence or phosphorescence origin of the PL.

Also in connection with this step, the controller 4 may be configured to store the second image(s) and spectrum/spectra and transients, and/or to process the second image(s) and spectrum/spectra and transients, e.g. by comparing to authentication criteria.

Figure 9A:
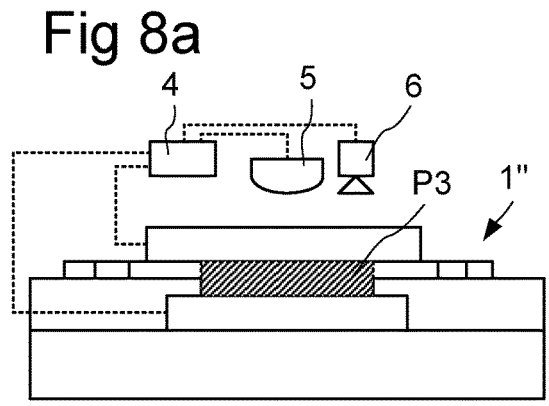
FIGS. 9a-9b schematically illustrate a third step in a method of operating an LEC.
Figure 9B:
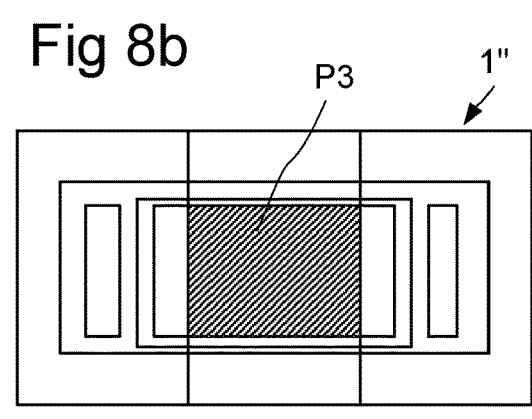

FIGS. 9a-9b schematically illustrate a third step in a method of operating an LEC 1".

In this step, the LEC 1" is electrically operated by application of a voltage between the electrodes 11 and 14, so as to cause the emission layer to emit light through electroluminescence (EL) in accordance with a third 2D pattern P3, which is provided through the portions where the electrodes 11 and 14 exhibit electrical contact with the PL-active portions of the emission layer 13.

In some embodiments, the light emission from P3 may be weak or absent when the LEC 1" is electrically operated.

The electrical operation of the LEC 1" may be controlled by the controller 4, and also during this step, the image capture device 6 may be used to acquire a third image distinguishing P3 from LEC 1".

In some embodiments, the image capture device 6 may also capture spectral information about the emitted light.

In some embodiments, the image capture device 6 may capture multiple images and spectra.

Also in connection with this step, the controller may be configured to store the third image(s) and spectrum/spectra, and/or to process the third image(s) and spectrum/spectra, e.g. by comparing to authentication criteria.

Figure 10A:
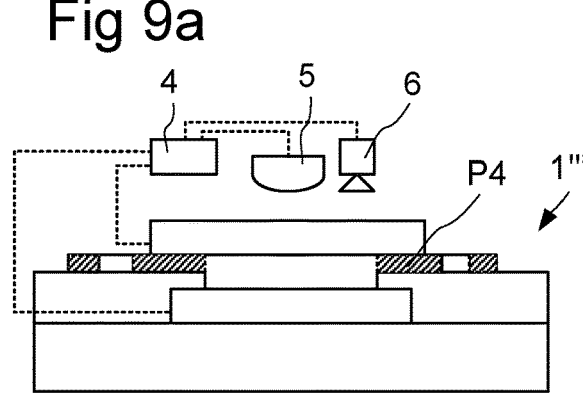
FIGS. 10a-10b schematically illustrate a fourth step in a method of operating an LEC.
Figure 10B:
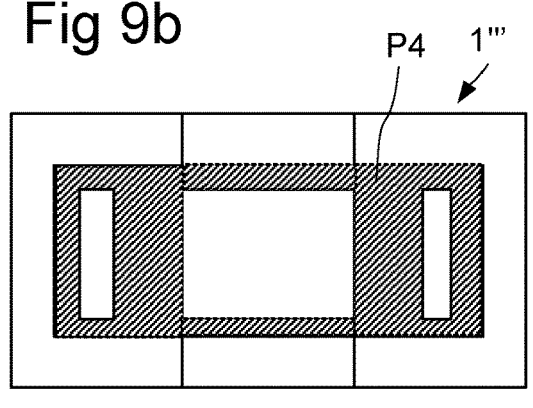

FIGS. 10a-10b schematically illustrate a fourth step in a method of operating an LEC 1".

In this step, the lamp 5 may be activated to expose the LEC 1" to light directly after electrical operation, such that the emission layer 13 is caused to emit light through PL in accordance to a fourth 2D pattern P4, which is provided through the difference between the second 2D pattern P2 and the third 2D pattern P3. This 2D pattern modification is produced by the electrical operation of the LEC during the third step, which causes a reversible and partial or complete loss of the PL capacity in the region corresponding to pattern P3. Hence, electrical operation of the LEC is required in order to observe the fourth 2D pattern.

The lamp 5 may be controlled by the controller 4, and also during this step, the image capture device 6 may be used to acquire a fourth image distinguishing P4 from LEC 1".

Again in some embodiments, the image capture device 6 may also capture spectral information about the PL light.

Again in some embodiments, the image capture device 6 may capture multiple images and spectra during different wavelength illumination conditions from lamp 5.

Also in connection with this step, the controller 4 may be configured to store the fourth image(s) and spectrum/spectra, and/or to process the fourth image(s) and spectrum/spectra, e.g. by comparing to authentication criteria.

In a fifth step, the lamp 5 may be continuously or temporary (in pulses) activated to expose the LEC 1'' to light after electrical operation such that PL-active portions of the emission layer 13 is caused to emit light through PL, allowing the observation of a gradual temporal shift from the fourth 2D pattern P4 back to the second 2D pattern P2, when the temporarily reduced PL capacity in the region corresponding to pattern P3 recovers.

Again the lamp 5 may be controlled by the controller 4, and also during this step, the image capture device 6 may be used to acquire a fifth set of images to track the temporal transformation of P4 back to P2 from LEC 1''.

Again in some embodiments, the image capture device 6 may also capture spectral information about the PL light.

In some embodiments, the image capture device 6 may capture images and spectra during different wavelength illumination conditions from lamp 5.

Also in connection with this step, the controller 4 may be configured to store the images and spectra, and/or to process the fifth set of images and spectra, e.g. by comparing to authentication criteria.

Figure 11:
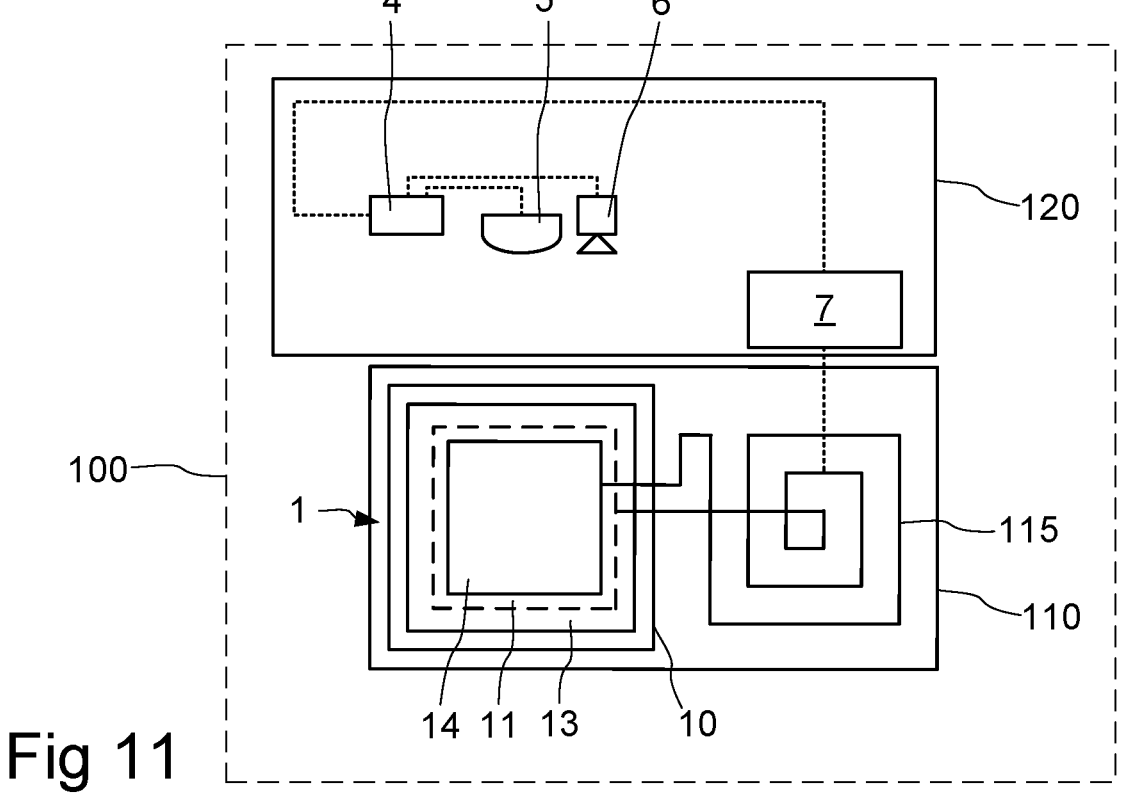
FIG. 11 schematically illustrates a security system, in which the LEC may be used.

Referring to FIG. 11, there is illustrated an example application of the present concept, in the form of a system 100 comprising a product 110 for use with an interrogation device 120.

The product 110 may be an identification or authentication device, such as identification or authentication documents, e.g. a passport, driving license, a certificate, a contract, a value document, a label or the like.

The product 110 may be formed from a sheet substrate, such as a paper, a cardboard, a plastic, a polymer-based material, a metal foil, or a flexible or non-flexible glass sheet. The product may be flexible or essentially non-flexible. Other surface configurations, including single curved, double curved, convex or concave surfaces may be used.

On the product there is applied an LEC 1 as described above. In some embodiments, the LEC substrate 10 may be applied to the product 110, such as by adhesion. In other embodiments, the product 110 itself may be used as the substrate onto which the LEC is fabricated, as exemplified above.

In FIG. 11 some parts of the LEC 1 have been left out for facilitating the understanding of the product. However, the electrodes 11, 14 and the emission layer 13 have been indicated.

A power supply 115 may be provided in or on the product. In some embodiments, the power supply 115 may, as illustrated, comprise an induction antenna, optionally with one or several diodes for rectification. In other embodiments, the power supply may comprise terminals for connection to an external power source. In yet further embodiments, the power supply may comprise an accumulator, such as a capacitor or a battery, and/or an electric generator, such as solar cell.

The interrogation device 120 may comprise a processing device 4, which may include the components necessary for receiving, processing, storing and communicating data.

The interrogation device 120 may further comprise an image capture device 6, such as a digital camera and/or a spectrometer. The image capture device 6, as discussed above, may be connected to the processing device 4, such that captured images and spectra can be received and processed by the processing device 4.

The interrogation device 120 may further comprise a light source 5 suitable for optical excitation of the emission layer, such as, but not limited to, a UV lamp or a broadband white-light source, which may be selected or tuned to provide light of the wavelengths necessary to cause PL in the emission layer 13 and/or to cause the appearance of the first 2D pattern P1. The light source 5 may be controllable by the processing device 4, e.g. in order to emit light in a desired wavelength region or on a selected temporal basis, such as in connection with data capture by the image capture device 6.

The interrogation device 120 may further comprise a power interface 7, for powering the LEC 1 by interaction with the power supply 115. Hence, the power interface 7 may comprise an induction device, terminals for connection to terminals on the product(s), and/or a light source for illuminating a solar cell.

In the following, production of an LEC device will be described in detail. Operation of the LEC device will then be described with reference to FIGS. 12a-12e.

Glass substrates (the substrate 10, area=50×50 mm$^2$, thickness=0.7 mm, Thin Film Devices) pre-coated with a 145 nm thick layer of ITO (the first electrode 11, sheet resistance=20 Ohm sq$^{-1}$) were cleaned and dried. A patterned film of the negative photoresist SU-8 was the insulating layer 12a, 12b. A diluted SU-8: ethyl acetate (1:15 by volume) ink was sprayed at 20 psi with an airbrush and briefly dried on a hotplate at 65° C. for <1 min. This resulted in the formation of a uniform and pinhole-free SU-8 film on the ITO surface. A photomask was positioned on top of the SU-8 film, which thereafter was exposed to UV light (UV-exposure Box 2, Gie-Tec GmbH) for 3 min. The exposed film was developed in ethyl acetate, followed by rinsing in IPA and drying by compressed air. The 12-star pattern, defined by the photomask, also defined effect (iii) in FIG. 12c.

The master solutions for the emission-layer ink were prepared by separately dissolving 8 g l$^{-1}$ Super Yellow (SY, $M_w$ (average repeat unit)=338 g mol$^{-1}$, Batch No. 4.80822.9999, PDY-132, Merck) and 10 g l$^{-1}$ tetrahexylammonium tetrafluoroborate (THABF$_4$, Sigma-Aldrich) in anisole under stirring on a hot plate at 70° C. for ≥24 h. The master solutions were mixed in a SY:THABF$_4$ weight ratio of 1:0.1. This mixture was further diluted with THE in a (ink:THF) volume ratio of 1:4.5 for the formation of the emission-layer ink. The emission-layer ink was spray-sintered through a shadow-mask (defining pattern (i) in FIG. 12a) onto the ITO-coated substrate, with the patterned SU-8 film on top, using a custom-built spraybox (LunaLEC) at an ink feed rate of 4 ml min$^{-1}$, 60 psi N$_2$ driving gas pressure, and with the movable spray nozzle completing 4 back-and-forward passes over the substrate. The substrate was kept at a constant 60° C. during the deposition of the emission layer 13.

The PL capacity of select parts of the emission layer 131a, 131b was permanently deactivated by 40 min exposure to UV light through a photomask in the UV-box under ambient conditions. The photomask pattern defined the PL pattern in effect (ii) in FIG. 12b.

For the second electrode 14, a poly(3,4-ethylenedioxy-thiophene)-poly(styrenesulfonate) (PEDOT:PSS, Clevios S V3, Heraeus) ink was first diluted with ethanol in a 1:5 volume ratio and then sonicated to form a homogenized sprayable ink. The second-electrode ink was sprayed with an ink feed rate of 4 ml min$^{-1}$, a 60 psi N$_2$ driving gas pressure, and 4 back-and-forward passes over the substrate, using a custom-built spraybox (LunaLEC). The substrate was kept at 60° C. during the spray deposition, and the deposited film further dried at 120° C. for 4 min. The LEC device was encapsulated with a glass cover slide attached with a UV-curable epoxy (Ossila) to allow for ambient-air operation. Ag paint (ELFA) was deposited on the edges of the substrate, in contact with the PEDOT:PSS top electrode, to assist with current distribution.

Figure 12A:
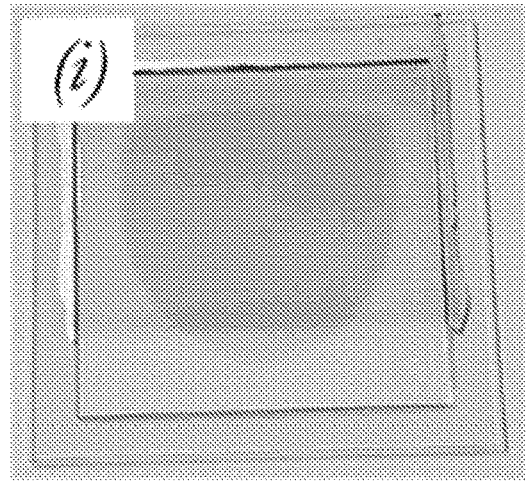
FIGS. 12a-12e are photos illustrating a proof-of-concept LEC device.
Figure 12B:
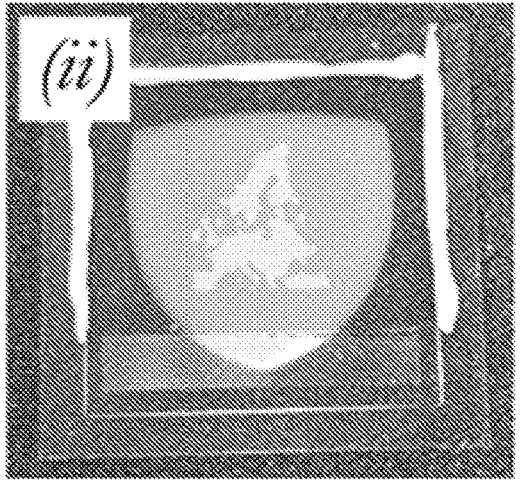
Figure 12C:
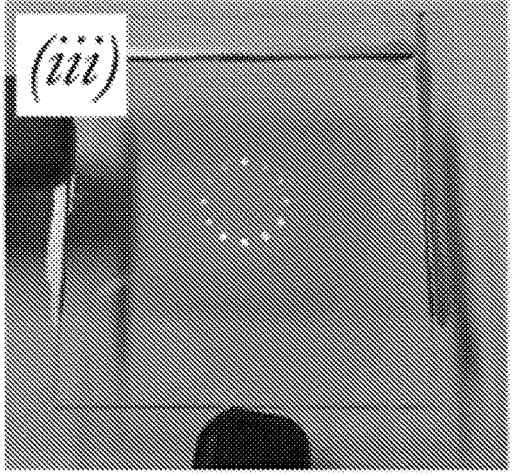
Figure 12D:
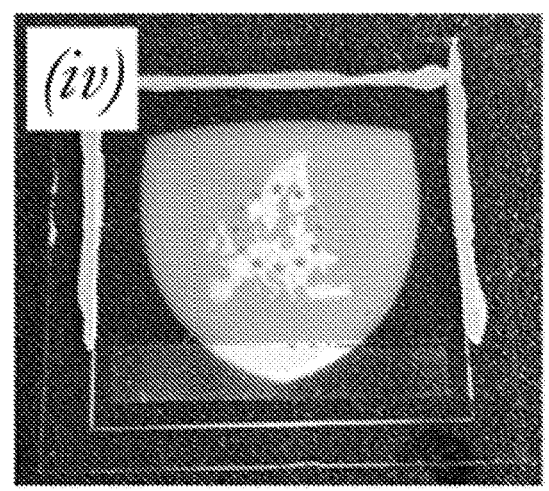
Figure 12E:
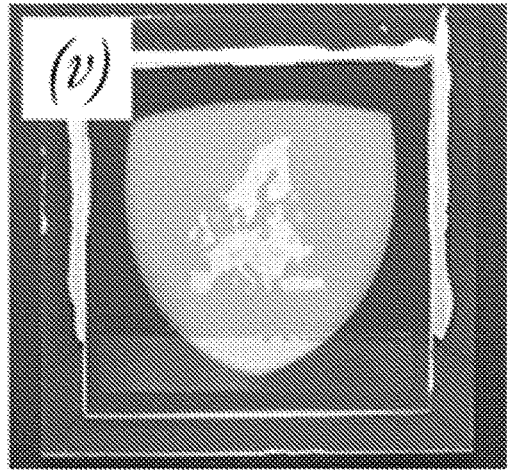

FIGS. 12a-12e shows photographs of the different patterns from an LEC proof-of-concept device, constituting (i) the (ambient-light activated) reflective color contrast between the emission layer pattern and the rest of the device (FIG. 12a; schematic pattern P1 in FIGS. 7a-7bk);

(ii) the (UV-activated) initial PL pattern before electrical operation (FIG. 12b; schematic pattern P2 in FIGS. 8a-8b);

(iii) the EL pattern during electrical operation (FIG. 12c, schematic pattern P3 in FIGS. 9a-9b);

(iv) the (UV-activated) second PL pattern after electrical operation (FIG. 12d, schematic pattern P4 in FIGS. 10a-10b);

(v) a snapshot of the (UV-activated) temporal transition from PL pattern (iv) back to PL pattern (ii) (FIG. 12e; temporal transition from schematic pattern P4 in FIGS. 10a-10b to schematic pattern P2 in FIGS. 8a-8b).

Hence, it is possible to attain at least five visual patterns from one single LEC device.

A brief description of the realization of these different patterns is provided below:

(i) The first 2D pattern can be realized by the deposition of the emission-layer ink. In the example above, it was realized by spray-sintering through a shadow mask. Alternatively, it can be produced through any of the various printing, coating and deposition techniques detailed in the emission-layer description above.

(ii) The second 2D (the initial PL) pattern can be created by select light exposure of the emission layer (e.g. through a photomask) in a reaction-molecule (e.g. $O_2$ and/or $H_2O$) containing atmosphere. This light-induced chemical reaction permanently reduces the PL capacity of the exposed regions of the emission layer. Alternatively, this pattern can be created by selective printing of different regions, which feature different PL properties.

(iii) The third 2D (the EL) pattern can be created by including a patterned insulating layer in between the emission layer and one of the electrodes, so that the EL-generating current only can flow in the regions void of this insulating layer. Alternatively, the EL pattern can be realized by patterning one (or both) of the electrodes. The patterned EL only appears when the device is electrically operated with e.g. a battery or wirelessly with e.g. an NFC field or a solar cell.

(iv) The fourth 2D (the second PL) pattern can be enabled by the LEC-specific electrochemical doping that takes place during the electrical operation of the LEC device. This doping quenches a significant fraction of the PL in the regions that emit EL light in accordance with the third 2D pattern. This results in that the initial PL pattern (ii) is modified into a new PL pattern (iv) after electrical operation of the LEC device in (iii).

(v) The electrochemical doping, and its associated quenching of the PL, will disappear with time, which results in that the PL pattern will gradually shift from pattern (iv) back to pattern (ii) with time. This backand-forth cycling between patterns (ii) and (iii) to (iv) can be repeated many times.

An additional feature is that the entire device can be transparent through the use of two transparent electrodes and a transparent emission layer, which results in that the all of the above patterns can appear to emerge out of nowhere (when a suitable illumination/excitation wavelength is used to illuminate the LEC and a suitable imaging device is used).

The invention claimed is:

1. A light-emitting electrochemical cell, comprising:
   a substrate,
   a first electrode,
   an emission layer, contacting the first electrode and providing a first two-dimensional (2D) pattern, which is made up by the emission layer being visually distinguishable from the substrate and/or one or more components associated with the light-emitting electrochemical cell, and
   a second electrode,
   wherein the emission layer provides a second 2D pattern, which is made up by first portions which are passive with respect to photoluminescence and second portions of the emission layer which are active with respect to photoluminescence, and
   wherein a third 2D pattern is provided by regions, which are active with respect to electroluminescence, where the first and second electrodes overlap and electrically contact the second portions of the emission layer.

2. The light-emitting electrochemical cell as claimed in claim 1, wherein the light-emitting electrochemical cell is configured such that the second 2D pattern is visually distinguishable when at least the second portions are optically excited to photoluminescence.

3. The light-emitting electrochemical cell as claimed in claim 1, wherein the light-emitting electrochemical cell is configured such that the third 2D pattern is visually distinguishable when an electrical potential is applied between the electrodes, and
   wherein the application of the electrical potential between the electrodes at least partially quenches photoluminescence of said regions,
   such that a fourth 2D pattern is visually distinguishable after the electrical potential has been removed and at least the second portions of the second 2D pattern are excited to photoluminescence.

4. The light-emitting electrochemical cell as claimed in claim 3, wherein the light-emitting electrochemical cell is configured such that a temporal transition from the fourth 2D pattern to the second 2D pattern, following electrical operation of the light-emitting electrochemical cell, is detectable by excitation of at least second portions of the second 2D pattern to photoluminescence.

5. The light-emitting electrochemical cell as claimed in claim 1, further comprising an insulating layer, which is selectively provided between the emission layer and one of the electrodes, such that the third 2D pattern, is at least partially determined by the insulating layer,
   wherein the insulating layer is formed from a material selected from a group consisting of polymers, ceramics, and glasses.

6. The light-emitting electrochemical cell as claimed in claim 1, wherein the emission layer comprises a blend of one or more organic and/or inorganic semiconductors and one or more sources of mobile ions,
   wherein the organic semiconductor is selected from a group consisting of non-ionic and ionic transition-metal complexes, conjugated polymers, conjugated small molecules, organic, carbon and perovskite quantum dots, and various types of specialty emitters featuring thermally activated delayed-fluorescence, or wherein the inorganic semiconductor is selected from a group consisting of inorganic quantum dots and perovskites, and the mobile ions are selected from a group comprising salts dissolved in ion-dissolving compounds and ionic liquids;

wherein the substrate is formed from one or more materials selected from the group consisting of glasses, polymers, pulp-based materials, metallic materials and meshes, and moisture and oxygen barrier materials; and wherein at least one of the electrodes is formed from one or more materials selected from a group consisting of metals, doped and pristine inorganic semiconductors, doped and pristine organic semiconductors, and polymers, the one or more materials being provided in the form of films, sintered particles, sintered nanoparticles, wires, nanowires, flakes, or wire meshes.

7. A security element, comprising a light-emitting electrochemical cell as claimed in claim 1, and a power supply, which is operatively coupled to the first and second electrodes, for selective activation of the light-emitting electrochemical cell.

8. A security system, comprising:
a security element as claimed in claim 7, and
an excitation light source configured to provide light of a wavelength range for causing photoluminescence in the emission layer,
further comprising:
at least one image capture device, and
at least one processing device, configured to:
receive data from the image capture device, the image representing at least part of an emission layer area of the security element, and
processing the data to determine authenticity of the security element.

9. A method of operating a light-emitting electrochemical cell comprising:
a substrate,
a first electrode,
an emission layer, contacting the first electrode and providing a first two-dimensional (2D) pattern, which is made up by the emission layer being visually distinguishable from the substrate and/or one or more components associated with the light-emitting electrochemical cell, and
a second electrode,
wherein the emission layer provides a second 2D pattern, which is made up by first portions which are passive with respect to photoluminescence and second portions of the emission layer which are active with respect to photoluminescence,
wherein a third 2D pattern is provided by regions, which are active with respect to electroluminescence, where the first and second electrodes overlap and electrically contact the second portions of the emission layer,
the method comprising:
providing the light-emitting electrochemical cell with only the first 2D pattern being visually distinguishable, exposing the light-emitting electrochemical cell to first excitation light, whereby the second portions of the emission layer are caused to provide photoluminescence, such that the second 2D pattern becomes visually distinguishable, and
electrically operating the light-emitting electrochemical cell so as to cause electroluminescence in said emission layer by applying an electric potential across the electrodes, such that the third 2D pattern becomes visually distinguishable.

10. The method as claimed in claim 9, further comprising:
stopping the electrical operation of the light-emitting electrochemical cell, and
subsequent to said electrical operation, exposing the light-emitting electrochemical cell to second excitation light, such that a fourth 2D pattern becomes visually distinguishable, said fourth 2D pattern corresponding to the second 2D pattern and an inverse of the third 2D pattern.

11. The method as claimed in claim 10, further comprising capturing a fourth image representing the light-emitting electrochemical cell during said exposure of the light-emitting electrochemical cell to said second excitation light.

12. The method as claimed in claim 11, further comprising capturing fourth spectral data representing photoluminescence from at least part of the light emitting electrochemical cell during said exposure of the light emitting electrochemical cell to said second excitation light.

13. The method as claimed in claim 9, wherein the electrical operation comprises one of reversibly quenching a photoluminescence capacity of the regions, and permanently quenching the photoluminescence capacity of the regions.

14. The method as claimed in claim 9, further comprising capturing a first image representing the light-emitting electro-chemical cell while the light-emitting electrochemical cell is exposed to at least non-excitation light and prior to said exposing of the light-emitting electrochemical cell to the first excitation light, and capturing a second image representing the light-emitting electrochemical cell during said exposing of the light-emitting electrochemical cell to the first excitation light, and
wherein capturing said first and/or second image comprises capturing first spectral data and/or second spectral data representing light emission from at least part of the light-emitting electrochemical cell during said exposing of the light-emitting electrochemical cell to the first excitation light.

15. The method as claimed in claim 9, further comprising at least one of:
capturing at least one emission intensity transient directly following said exposing of the light-emitting electrochemical cell to the first excitation light, thus enabling a distinction between fast-decaying fluorescence and comparatively slow-decaying phosphorescence;
capturing a third image representing the light-emitting electrochemical cell during said electroluminescence; and
capturing third spectral data representing light emission from at least part of the light-emitting electrochemical cell during said electroluminescence.

16. The method as claimed in claim 9, wherein said electrical operation is performed according to one of the following:
electrical operation is performed subsequently to said exposure of the light-emitting electrochemical cell to the first excitation light; and
said electrical operation is performed prior to said exposure of the light emitting electrochemical cell to the first excitation light.

17. The method as claimed in claim 9, further comprising capturing at least two images representing the photoluminescence from the light-emitting electrochemical cell, during said exposure of the light-emitting electrochemical cell to the second excitation light, at different points in time, wherein said points in time occur during a recovery phase in which the photoluminescence recovers from an electrochemical doping quenching, and wherein spectral data are captured for at least some of the images representing the light-emitting electrochemical cell at different points in time during a recovery phase, during which said photoluminescence recovers.

18. A method of manufacturing a light-emitting electrochemical cell, comprising:

providing a substrate, depositing a first electrode on the substrate, depositing an emission layer, which contacts and at least partially overlaps the first electrode, to provide a first two-dimensional (2D) pattern, which is made up by emission layer being visually distinguishable from the substrate and/or one or more components associated with the light-emitting electrochemical cell, providing a second 2D pattern, which is made up by first portions which are passive with respect to photoluminescence and second portions of the emission layer which are active with respect to photoluminescence, and depositing a second electrode, which contacts and at least partially overlaps the emission layer, and which at least partially overlaps the first electrode, to form regions which are active with respect to electroluminescence.

19. The method as claimed in claim 18, wherein said providing the second 2D pattern comprises providing deactivated portions of the emission layer by selectively deactivating portions of the deposited emission layer.

20. The method as claimed in claim 18, wherein said providing the second 2D pattern comprises providing deactivated portions by selectively depositing non-active material with respect to photoluminescence.

21. The method as claimed in claim 18, wherein the electrodes are selectively deposited with an overlap and with electrical contact with the portions of the emission layer with its photoluminescence being active, according to a third 2D pattern.

22. The method as claimed in claim 18, further comprising selectively depositing at least one insulating layer between the active material layer and one of the electrodes.

23. The method as claimed in claim 22, wherein the insulating layer is selectively deposited according to a third 2D pattern.

* * * * *